(12) United States Patent
Chu et al.

(10) Patent No.: US 6,478,932 B1
(45) Date of Patent: Nov. 12, 2002

(54) COMBINATION PROCESS OF VACUUM SPUTTERING AND WET COATING FOR HIGH CONDUCTIVITY AND LIGHT ATTENUATION ANTI-REFLECTION COATING ON CRT SURFACE

(75) Inventors: Jau-Jier Chu, Hsinchu (TW); Jau-Sung Lee, Hsinchu (TW); Cheng-Chen Shih, Hsinchu (TW); Shao-Chi Chang, Hsinchu (TW)

(73) Assignee: Applied Vacuum Coating Technologies Co., Ltd., Hsinchu (TW)

( * ) Notice: Subject to any disclaimer, the term of this patent is extended or adjusted under 35 U.S.C. 154(b) by 0 days.

(21) Appl. No.: 09/885,036

(22) Filed: Jun. 21, 2001

(51) Int. Cl.⁷ ................ C23C 14/34; B05D 5/06; G02B 1/11
(52) U.S. Cl. ............... 204/192.28; 204/192.15; 204/192.26; 204/192.27; 204/192.29; 427/162; 427/164; 427/166; 427/163.1
(58) Field of Search ............ 204/192.15, 192.26, 204/192.28, 192.29, 192.27; 427/162, 164, 166, 109

(56) References Cited

U.S. PATENT DOCUMENTS

| | | |
|---|---|---|
| 4,921,760 A | 5/1990 | Tani et al. |
| 4,945,282 A | 7/1990 | Kawamura et al. |
| 5,091,244 A | 2/1992 | Bjornard |
| 5,105,310 A | 4/1992 | Dickey |
| 5,147,125 A | 9/1992 | Austin |
| 5,170,291 A | 12/1992 | Szczyrbowski et al. |
| 5,216,542 A | 6/1993 | Szczyrbowski et al. |
| 5,362,552 A | 11/1994 | Austin |
| 5,407,733 A | 4/1995 | Bjornard et al. |
| 5,541,770 A * | 7/1996 | Pellicori et al. ........ 359/585 |
| 5,579,162 A | 11/1996 | Bjornard et al. |
| 5,728,456 A | 3/1998 | Adair et al. |
| 5,783,049 A | 7/1998 | Bright et al. |
| 5,976,684 A | 11/1999 | Oyama et al. |

* cited by examiner

*Primary Examiner*—Patrick Ryan
*Assistant Examiner*—Gregg Cantelmo
(74) *Attorney, Agent, or Firm*—Rosenberg, Klein & Lee

(57) ABSTRACT

A combination process of vacuum sputtering and wet coating produces a high conductivity and light attenuation anti-reflection coating on a substrate of a CRT surface. The coating includes five layers by vacuum sputtering and one layer on top of the coating by conventional wet process. The layers produced by vacuum sputtering provides high anti-reflection, low resistivity, and light-attenuation effect. The layer produced by wet process provides fingerprint proof effect.

12 Claims, 3 Drawing Sheets

COMBINATION PROCESS OF VACUUM SPUTTERING AND WET COATING FOR HIGH CONDUCTIVITY AND LIGHT ATTENUATION ANTI-REFLECTION COATING ON CRT SURFACE

BACKGROUND OF THE INVENTION

The present invention relates to a coating process composed of an optically effective layer system, for CRT glass substrate, whereby the layer system has a high anti-reflection, low resistivity, and light-attenuation effect. More specifically the invention relates to a combination of vacuum sputtering process which produce high conductivity of oxide films and a wet process which produce silica overcoat from traditional spin coating.

U.S. Pat. No. 4,945,282, whose disclosure is an image display panel having anti-static film with transparent and electro-conductive properties and process for processing same. The layer system including, $SnO_2$, $In_2O_3$, $Sb_2O_3$, and $SiO_2$. All the thin films of the layer system are produce by wet chemical process. There are 2 layers in the layer system. For a given example, the total thickness of the 2-layer structure was up to 2000 angstroms. The materials and thickness of the two films are antistatic coat ($SnO_2$, $In_2O_3$, $Sb_2O_3$), 50–800 angstroms and $SiO_2$, 1000±200 angstroms respectively.

U.S. Pat. No. 5,976,684, whose disclosure is an organic substrate provided with a light absorptive antireflection film and process for its production. The layer system including an organic substrate with acrylic hard coat layer, SiN, TiN and $SiO_2$. The thin films of the SiN, TiN and $SiO_2$ layer are produced by vacuum sputtering process. There are 3 to 4 thin layers in the layer system. For a given example, the total thickness of the 4-layer structure was about 1000 angstroms. The materials and thickness of the two thicker films of the 4-layer structure are TiN, 20–200 angstroms and $SiO_2$, 600–1100 angstroms respectively.

U.S. Pat. No. 4,921,760, whose disclosure is a multi-layer anti-reflection coating with excellent adhesion between $CeO_2$ layer and synthetic resin. The layer system including $CeO_2$, $Al_2O_3$, $ZrO_2$, $SiO_2$, $TiO_2$ and $Ta_2O_5$. All the thin films of the layer system are produce by vacuum evaporation or sputtering process. There are 3 to 5 thin layers in the layer system. For a given example, the total thickness of the 5-layer structure was about 3580 angstroms. The materials and thickness of the two thicker films of the 5-layer structure are $CeO_2$, 1360 angstroms and $SiO_2$, 1220 angstroms respectively.

U.S. Pat. No. 5,105,310, whose disclosure is a multi-layer anti-reflection coating designed for deposition in in-line coating marching by reactive sputtering. The layer system including $TiO_2$, $SiO_2$, ZnO, $ZrO_2$ and $Ta_2O_5$. All the thin films of the layer system are produced from vacuum evaporation or sputtering process. There are 4 to 6 thin layers in the layer system. For a given example, the total thickness of the 6-layer structure was about 4700 Angstroms. The materials and thickness of two thicker film of the layer system are ZnO, 1370 Angstroms and $SiO_2$, 1360 Angstroms respectively.

U.S. Pat. No. 5,091,244 and 5,407,733, disclosed a new type electric conductive light-attenuating anti-reflection coating. The major claim is an article comprision of nitrides of certain transition metal to provided an electrically-conductive, light-attenuating, anti-reflection surfaces. The layer systems including TiN, NbN, $SnO_2$, $SiO_2$, $Al_2O_3$, and $Nb_2O_5$. The thin films of the layer system are nitride and oxide materials. There are 3 to 4 thin layers in the layer system. For a given example, the total thickness of the 4-layer structure was about 1610 Angstroms. The materials and thickness of the two thicker films of the layer system are ZnO, 650 Angstroms and $SiO_2$, 820 Angstroms, respectively. The transmission of visible light of these two layer systems is below 50%. All the thin films of the. layer system are produced by vacuum evaporation or sputtering process.

U.S. Pat. No. 5,147,125, whose disclosure is a multi-layer, anti-reflection coating using zinc oxide to provide UV rejection for wave-lengths shorter than 380 nm. The layer system including $TiO_2$, $SiO_2$, ZnO, and $MgF_2$. All the thin films of the layer system are produced from vacuum evaporation or sputtering process. There are 4 to 6 thin layers in the layer system. For a given example, the total thickness of the 5-layer structure was about. 7350 Angstroms. The materials and thickness of the two thicker films of the layer system are ZnO, 4390 Angstroms and $MgF_2$, 1320 Angstroms, respectively. All the thin films of the layer system are produced by vacuum evaporation or sputtering process.

U.S. Pat. No. 5,170,291 disclose a 4-layer system which is optical effective and has a high anti-reflective effect. The layers can be formed by either a pyrolytic method, a plasma-supported chemical vapor deposition method, a sputtering method or a chemical deposition method. The layer system including $SiO_2$, $TiO_2$, $Al_2O_3$, ZnS, MgO and $Bi_2O_3$. For a given sample, the total thickness of the 4-layer structure was about 2480 Angstroms. The materials and thickness of the two major films of the layer system are $TiO_2$, 1040 Angstroms and $SiO_2$, 940 Angstroms, Respectively.

U.S. Pat. No. 5,216,542 whose disclosure is a 5 layer coating with high anti-reflection effect. The process use an adhesive layer of Ni, Cr or NiCr metal with a thickness about 1 nm (manometer). Other four layers are compose of $SnO_2$, $ZrO_2$, ZnO, $Ta_2O_5$, NiO, $CrO_2$, $TiO_2$, $Sb_2O_3$, $In_2O_3$, $Al_2O_3$, $SiO_2$, TiN and ZrN. For a given example, the total thickness of the 5 layer structure was about 2337 angstroms. The materials and thickness of the two majority films of the layer system are $TiO_2$, 500 Angstroms and $SiO_2$, 1387 Angstroms, respectively. The transmission of visible light of this layer system is below 30%. All the thin films of the layer system are produced by vacuum evaporation or sputtering process.

U.S. Pat. No. 5,541,770 whose disclosure is a light attenuating anti-reflection coating including electrically conductive layers. It is a four or five layer system. A light absorption high refractive index metal such as Cr, Mo and W was used as a optically effective thin film in the layer system. The other three or four layers are $TiO_2$, ITO, $Al_2O_3$, $SiO_2$ and TiN. The patent shows that the majority materials of the layer system are oxide and nitride; only one metal film was used as an optical effective thin film in the anti-reflection coating. All the thin films of the layer system are produced by vacuum evaporation or sputtering process. For a given example, the total thickness of the 5-layer structure was about 1495 angstroms. The materials and thickness of the majority films of the layer system are ITO, 334 Angstroms and $SiO_2$, 720 Angstroms. The transmission of visible light of this layer system is below 60%.

U.S. Pat. No. 5,362,552 whose disclosure is a 6-layer anti-reflection coating includes three layers of electrically-conductive metal oxide. The layer system including $SiO_2$, ITO, $Nb_2O_5$, and $Ta_2O_5$. Up to a total optical thickness of about one-wavelength of visible light of the electrically conductive metal oxide may be included in the coating. For one of given example of 6 layer structure, the materials and thickness of the majority two layers within this 6 layer system are $SiO_2$, 854 Angstroms and ITO 1975 Angstroms. All the thin films of the layer system are produced by vacuum evaporation or sputtering process.

U.S. Pat. No. 5,579,162 disclosed a 4-layer anti-reflection coating for a temperature sensitive substrate such as plastic. One layer is a DC reactively sputtered metal oxide which may be deposited quickly and without imparting a large amount of heat to the substrate. The layer system including $SnO_2$, $SiO_2$ and ITO. For one of given example of the 4 layer structure, the materials and thickness of the majority two layers within this system are $SnO_2$, 763 Angstroms and $SiO_2$ 940 Angstroms. All the thin films of the layer system are produced by vacuum evaporation or sputtering process.

U.S. Pat. Nos. 5,728,456 and 5,783,049, disclosed an improved way to deposit anti-reflection coating on plastic film. The multi-layer thin films were coated by a roller coating with vacuum sputtering process. The layer system including ITO, $SiO_2$, and a thin lubricating over layer which is a solvent-soluble fluoro-polymer. For a given example, the total thickness of the 6 layer system was about 2630 Angstrom. The materials and thickness of the two major film of the layer system are Ito, 888 Angstrom and $SiO_2$, 869 Angstrom.

The above description shows clearly that all the films of a layer system with high anti-reflection, anti-static, and free control of transmission effect were produced by wet chemical coating, vacuum evaporation and/or sputtering process. On the other hand, the thickness of the major layer of high refractive index materials in the layer system was between about 700 to 2000 angstrom and the thickness of the major layer of low refractive index materials in the layer system was between about 700 to 1400 angstrom.

SUMMARY OF THE INVENTION

An object of the present invention is to provide an anti-static coating by sputtering process and combine an anti-reflection coating by wet chemical process such as spin coating, spray coating and etc. for image panel display application.

The process of manufacturing transparent conductive oxide thin film in volume production was high reliable and was routinely need in the industries such as semiconductor, display, architecture glass and plastic web coating for a long time. Because of the low resistance and high transparent conductive oxide thin film was easy to deposit by sputtering process than wet process (either in process of spin coating or spray coating). The present invention provided the anti-static, anti-reflection, and free control of transmission coating in a combination system of vacuum sputtering and wet coating process. It is well known that the coating of conductive oxide materials such as $SnO_2$, ZnO, $In_2O_3$, $SnO_2$:F, $SnO_2$:Sb, $In_2O_3$:Sn, ZnO:Al, $Cd_2SnO_4$, $In_2O_3$—ZnO, $SnO_2$—ZnO and $In_2O_3$—MgO, etc. is quite high cost, low performance (high resistance), and low utilization (about 3~5% of chemical solution) from wet coating process. A roughly estimate show that for a conventional wet coating system of CRT surface of a total thickness of about 200 nm (ITO: 100 nm, silica: 100 nm) was required to form an anti-static effective ($10^3$~$10^5$ $\Omega$/square) and optically effective anti-reflection coating. Experimentally shows that wet coating process of conductive oxide materials such as ITO, ATO, IZO and AZO, etc. with a thickness above 100 nm impart low uniformity, high resistance, low transmittance and high cost due to the spin coating and dry baking from solution of those materials. For a typical conductive oxide sputtering process, the thickness of the thin film is below 50 nm to reach the resistance of $10^2$~$10^3$ $\Omega$/square, and the uniformity of the thin film is less than 3% which is important for optically effective in anti-reflection coating. On the other hand, for a wet process system the hardness of coating is about 6 H and for a vacuum sputtering process, the hardness of coating is about 8~9 H. The combination of vacuum sputtering process and wet process made a coating with the hardness of about 7–9 H. The present invention is to provide the anti-reflection with anti-static layer system compose of basically five layers of oxide and metal materials deposit by PVD system and only one layer of silica deposit by wet process from chemical solution. The design of vacuum sputtering process not only provide a high conductive ITO film in the CRT coating but also provide free control of transmission layer to meet the panel display transmission from 45% to 55%. There also have one adhesion layer to increase the adhesion between panel glass and metal layer, and two layer of diffusion barrier to prevent the interaction between ITO and wet chemical solution. The wet chemical coating process provided a good anti-smudge function than vacuum evaporation and/or sputtering. The present invention provided a high conductive anti-static process of anti-reflection coating and light control of transmission coating, which can be applied on the CRT surface coating.

There are six layers, namely, the first, second, third, fourth, fifth, and sixth layers in consecutive numerical order beginning with the layer nearest from the substrate for the present invention of anti-static/anti-reflection coating. The each layer was described in terms of physical thickness or optical thickness. The optical thickness is a mathematical product of a layers thickness and its refractive index. It is described as a fraction of a designed wavelength. In the present invention the designed wavelength is about 520 nm.

The first or the innermost layer is an oxide material. The oxide layer, preferably $SiO_2$, substantially non-absorption for visible light, has a refractive index between 1.45 to 1.50 at a wavelength of about 520 nanometer (nm) and a physical thickness of between 10 nm to 30 nm at the design wavelength.

The second layer comprises metals selected from a group consisting of Ni, Cr, Ta, Ti, V, Co and ss (stainless steel) and a mixture of these metals. The second layer has a refractive index between 1.5 and 4.0.

The third layer is a transparent conductive oxide material. The conductive oxide layer, preferably ITO, substantially little absorption for visible light, has a refractive index between 1.85 to 2.1 at a wavelength of about 520 nanometer (nm) and an optical thickness of about one sixth to one tenth wave length at the design wavelength.

The fourth layer is an oxide material. The oxide layer, preferably $Cr_2O_3$, substantially little absorption for visible light, has a refractive index between 2.0 to 2.5 at a wavelength of about 520 nanometer (nm) and a physical thickness of between 10 nm to 30 nm at the design wavelength.

The fifth layer is also an oxide material. The oxide layer, preferably $SiO_2$, substantially non-absorption for visible light, has a refractive index between 1.45 to 1.50 at a wavelength of about 520 nanometer (nm) and a physical thickness of between 10 nm to 30 nm at the design wavelength. The sixth layer is the same as the first and fifth layers, but the first and fifth layers material is coated by sputtering method and the sixth layer is prepared by wet process from TEOS solution. The material commonly is called silica. This layer has a refractive index between 1.45 to 1.55 and an optical thickness of about one fourth wave length at the design wavelength.

In the preferred embodiment, the six layers coating include a first layer of $SiO_2$ having a thickness about 20 nm. A second layer of Cr having a thickness about 3 nm. A third layer of ITO having a thickness about 35 nm. A fourth layer of $Cr_2O_3$ having a thickness about 20 nm. A fifth layer of $SiO_2$ having a thickness about 20 nm, and a sixth layer is a layer of silica having a thickness about 80 nm.

The stated objects are achieved by the invention, a low resistance between $10^2$ Ω/square~$10^3$ Ω/square can be obtain from the ITO coating, and a low reflection spectrum can be obtain on the CRT substrate in the visible range from 400 nm to 700 nm. The total reflection is below 0.5% and the light transmission is between 45% to 55% from 400 nm to 700 nm in this 6 layers optical coating. It is demonstrated that the process is simple, reliable, easy control and economically. It has become possible in this way to produce an extremely low resistance, high hardness and low reflectance anti-reflection coating. Of particulate advantage, a batch or in-line sputtering system was suggest to deposit the first, second, third, fourth and fifth layer of the present invention for low resistance, high optical performance, high scratch resistance, and free control of transmission. A wet coating process system was suggested to deposit the sixth layer of silica for low surface energy and low cost manufacturing.

On the other hand, the layer system of this invention is of high conductive for EMI (Electromagnetic Interference) shielding, extremely low reflection for optical view, free control of transmission from 45% to 55%, high scratch resistance for surface hardness, low surface energy for anti-smudge and low cost for manufacturing. For instance, a six layer anti-reflection and anti-static coating on CRT glass substrate according to the combination process of sputtering and wet process is described in this embodiment. The layer system has a low resistance between $10^2$ Ω/square to $10^3$ Ω/square to pass the certification of TCO 99, the layer system has the transmission from 45% to 55% for clear image panel glass, the layer system is hard enough to pass the scratch test of military standard MIL-C-48497 or MIL-C-675 and the optical quality is good enough to achieve the low reflection of CRT surface.

Thereby, a DC, AC or RF magnetron sputtering can be provide to deposit the first, second, third, fourth and fifth layers from Si, Cr, ITO, Cr and Si targets in the presence of a sputter gas of mixture Ar and $O_2$, under a given pressure of approximately 3 m Torr (m=mili=0.001). For the sixth layer, it is proposed that by using wet process method such as spin coating or spray coating from a TEOS solution in the presence of coating under a temperature of 33° C. and baking condition of 180° C.~200° C./30 min.

The various objects and advantages of the present invention will be more readily understood from the following detailed description when read in conjunction with the appended drawing, in which:

DESCRIPTION OF THE PREFERRED EMBODIMENTS

The stated objects are achieved by the invention, a low resistance, low reflectance and 45%~55% transmission can be obtain on CRT substrate in the visible light range from 400 nm to 700 nm by coating six layers with sputtering and wet coating process. The multi-layer structure are numbered in sequence beginning from the innermost layer i.e. the layer first from a substrate surface on which the thin films is deposited. Layers thickness values are specified as either a physical thickness in nm or as an optical thickness as some fraction or multiple of a wavelength of visible light. The typical value is 520 nm.

Figure 1:
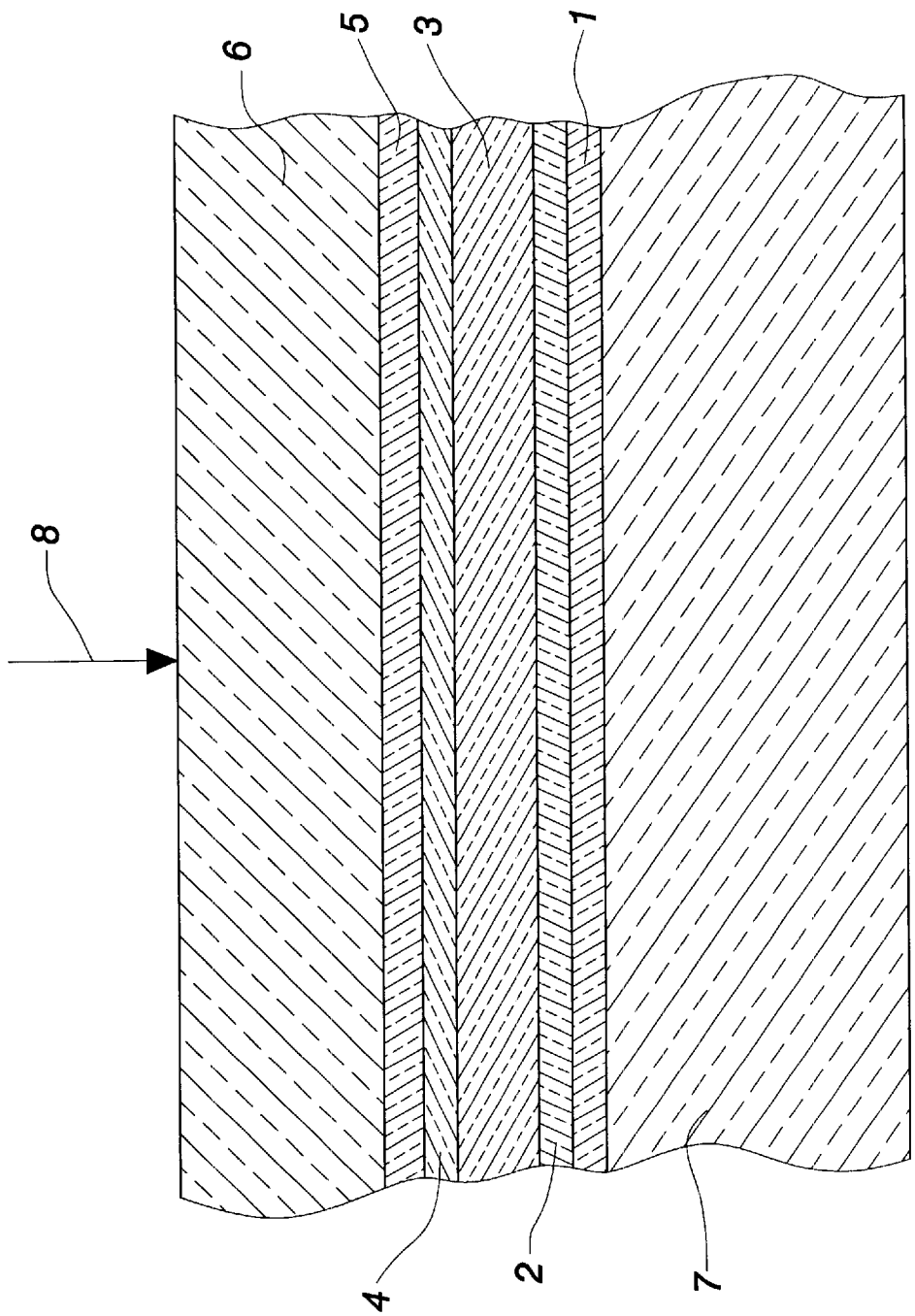
FIG. 1 schematically shows a cross sectional view of a layer system according to the present invention.

The layer structure of a preferred embodiment of the present invention is shown in FIG. 1. A substrate 7 can be a CRT glass, or another see-through materials. The direction of viewing is indicated by arrow 8. A layer 1, which is contacting the front side of the substrate 7, is called a first layer 1. In the direction to the observer follows the second layer 2 being arranged on the first layer 1, which is next to the front surface of the substrate. The third layer 3 of the six layers being arranged on second layer 2. The fourth layer 4 of the six layers being arranged on third layer 3. The fifth layer 5 of the six layers being arranged on fourth layer 4. The sisth layer, or the outermost layer 6 being arrange on the fifth layer 5. The layers 1,2,3,4,5 and 6 form a layer system of the present invention.

In the present invention sample, the first layer is silicon dioxide ($SiO_2$) with a thickness of 20 nm. The silicon dioxide has a refraction index of about 1.46 at a wavelength of about 520 nm. The $SiO_2$ is proposed as a adhesion enhance layer to increase the adhesion between panel glass substrate, layer 7, and second layer 2. The second layer 2 of the layer system is a Cr layer with a thickness about 3 nm. The Cr metal is proposed as a light-attenuation layer for transmission control. The third layer is indium tin oxide (ITO) with a thickness of 35 nm. It has a refractive index of about 1.98 at a wavelength of about 520 nm. It is the major electro-conductive layer. The fourth layer is Cr oxide with a thickness of 20 nm. The Cr dioxide has a refraction index of about 2.3 at a wavelength of about 520 nm. The fifth layer 5 of the layer system is a $SiO_2$ layer with a thickness of 20 nm. The silicon dioxide has a refraction index of about 1.46 at a wavelength of about 520 nm. The $Cr_2O_3$ and $SiO_2$ is proposed as a diffusion barrier to prevent the interaction of ITO and wet chemical from the wet process. The sixth layer is silica with a thickness of 80 nm. The sixth layer has a refractive index of about 1.46–1.5 at a wavelength of about 520 nm. It was the only one layer material that coated by wet process from TEOS solution in atmosphere. The other layers of 1,2,3,4 and 5 were coated by sputtering process in vacuum system. In this invention, the optical performance of the layer system is a wide band low reflection coating.

Figure 2:
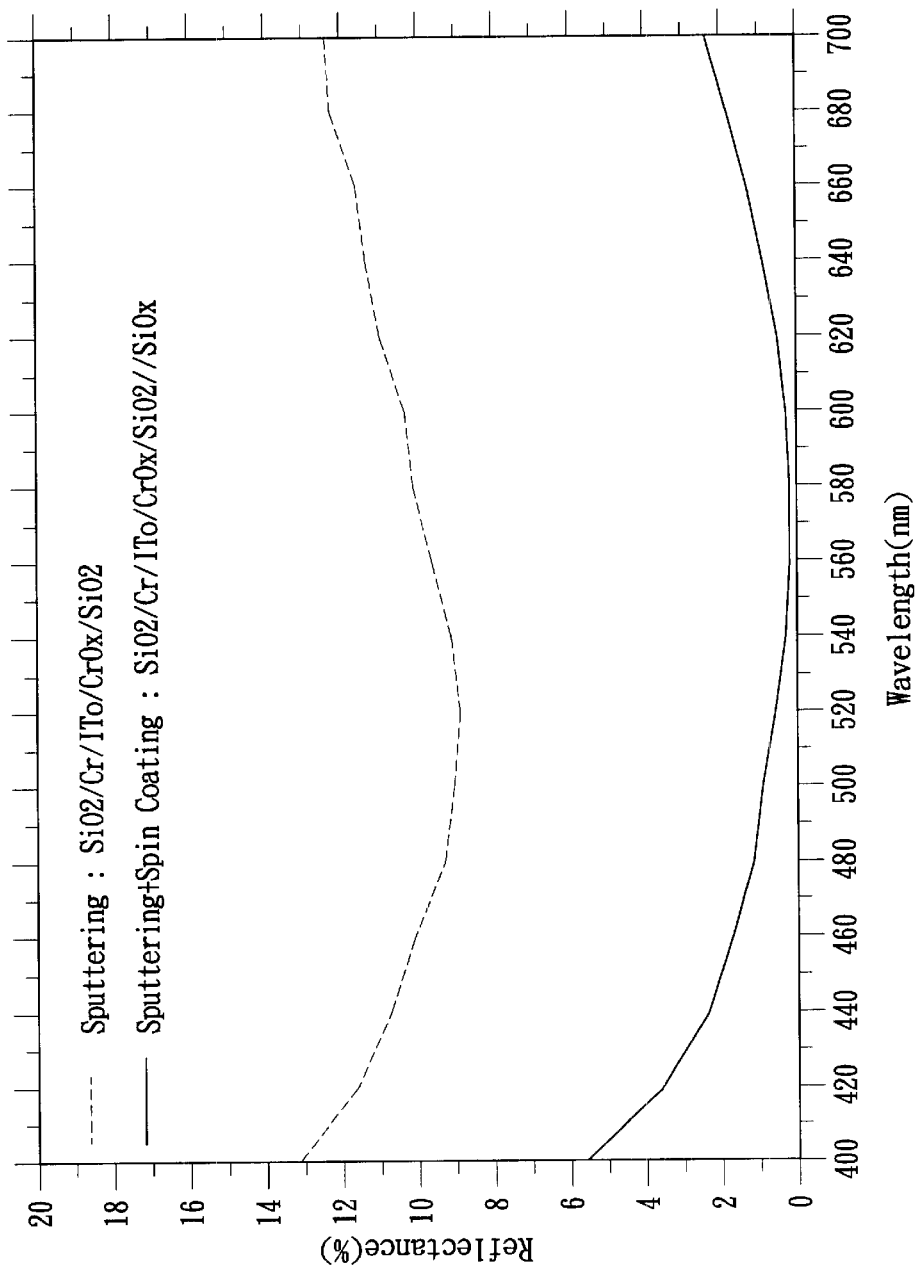
FIG. 2 shows the measured reflection curve in percent versus wavelength in nm of a layer system according to the present invention.

FIG. 2. shows the real reflection spectrum for the layer system of this invention. The reflection was measured in percent at the front surface of the CRT glass. The visible spectrum is from a wavelength of 400 nm to a wavelength of 700 nm. The dot-line curve reveals the reflection of layer 1, 2, 3, 4 and 5 that are coated by sputtering system. The curve line of the six layer system reveals clearly that the reflection in the core wavelength region of the light particularly between 520 and 630 nm is extra ordinarily low 0.5% and the reflection is below 5.5% in any wavelength range 400 nm to 700 nm. The optical performance is a low reflection wide band coating and the photopic reflectance is below 0.5% in the wavelength range from 400 nm to 700 nm. The resistance of the layer system is about 1.8~2.3×10² Ω/square, the transmission of the layer system is about 52%, and the pencil hardness is more than 7 H. Table 1. and Table 2. Show all the data of reflection from 400 nm to 700 nm, resistance, pencil hardness, CIE color, transmittance and etc.

Figure 3:
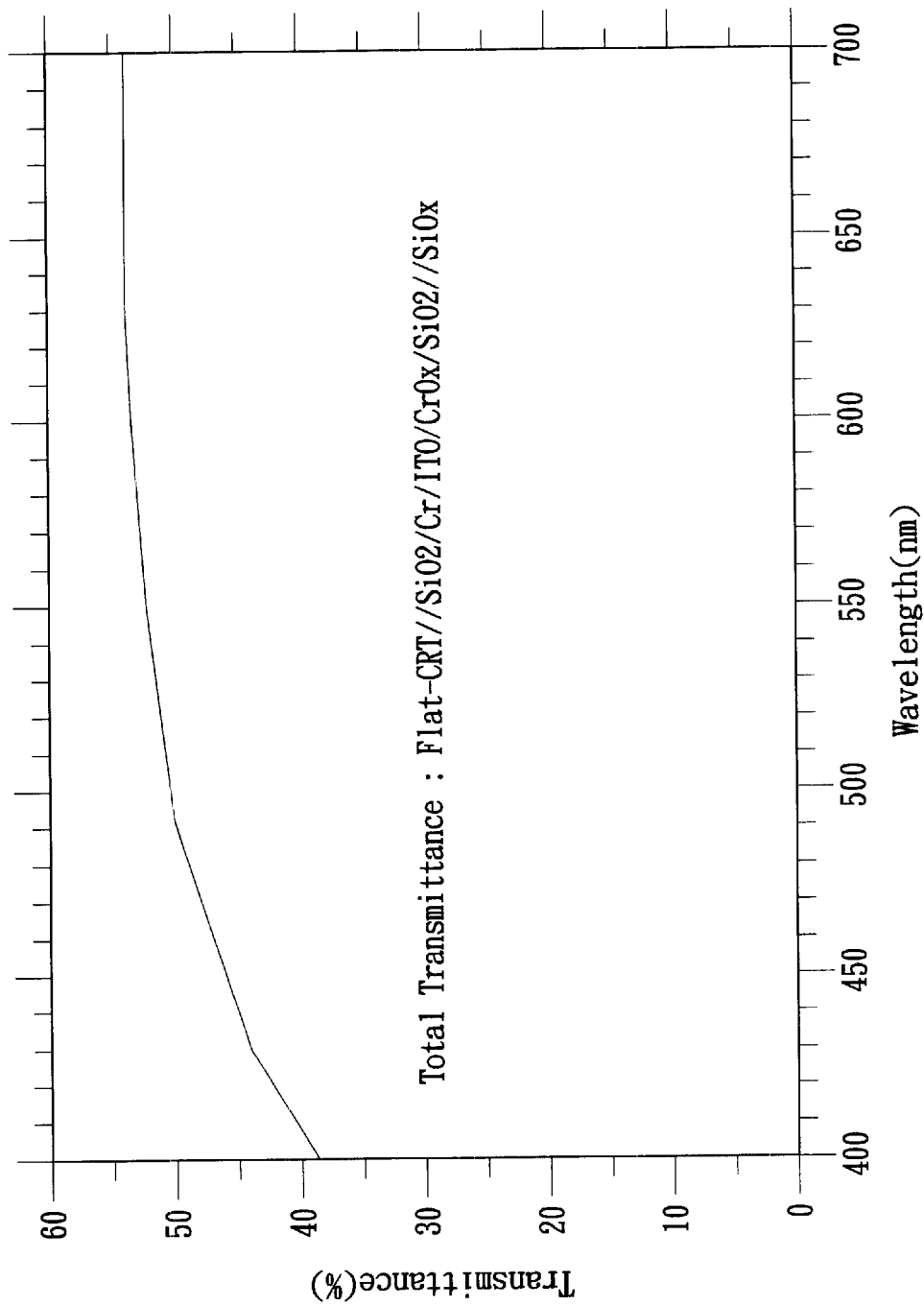
FIG. 3 shows the measured transmission curve in percent versus wavelength in nm of a layer system according to the present invention.

FIG. 3. shows the real transmission spectrum for the layer system of this invention. The transmission was measured in percent from the panel of the CRT glass.

The sputtering of oxide layer 1, 3, 4 and 5 were performed with a magnetron cathode in a reactive gas atmosphere composed of a gas mixture of Ar and $O_2$. The sputtering of metal Cr layer 2 was sputtered with a magnetron cathode in Ar gas only. The target materials for layer 1, 2, 3, 4 and 5 were Si, Cr, ITO, Cr and Si, respectively. The target to substrate distance was about 15 cm. No heating device as applied during sputtering process. The silica layer 6 was coated with TEOS chemical solution by spin coating at the 33° C. substrate temperature then baking at the temperature of 180° C.~200° C./30 min in atmosphere. All the working condition during sputtering and spin coating were described as table 3. Moreover, the wet process coating consists of a spin coating or spray coating or sol-gel or slurry in either a batch or an in-line system.

The following advantages are achieved with the invention:

The conventional wet process coating of anti-static and anti-reflection for CRT is difficult to pass the certification of TCO99, the film thickness and quality are very sensitive to temperature, it will rising many problem including resistance, optical effective and etc. The cost of chemical solution for low resistance wet coating process is very high and difficult to reach the order of $10^2$ Ω/square. The present invention provided a six layer system which included sputtering of five layers and wet process coating of one oxide layer. In this optical layer system, the thickness of first, second, third, fourth and fifth layers are 20, 3, 35, 20 and 20 nm, respectively. The thickness of sixth layer of silica is about 80 nm. Because of the vacuum sputtering of conductive layer the resistance of the layer system in the present invention is low enough to reach $10^2$ Ω/square. The second layer of Cr is a light-attenuation layer, it will free control of transmission to reach 45%~55% in the optical layer system. The fourth layer and the fifth layer are also deposited by sputtering, it can be used as a diffusion barrier to prevent the interaction of ITO and wet chemical from the wet process. The sixth layer of silica is coating by wet process, it is a conventional process with low cost and low surface energy. Of particular interest, the resistance of the layer system is about $2\times10^2$ Ω/square, the reflection is below 5.5% in the wavelength range from 400 nm to 700 nm, the photopic reflectance of the whole spectrum is below 0.5%, and the finger print free by low surface energy from the combination of wet chemical process. It is a high performance of conductivity for CRT application.

Although various minor modification may be suggested by those versed in the art, it should be understood that we wish to embody within the scope of the patent granted hereon all such modifications as reasonably and properly come within the scope of our contribution to the art.

TABLE 1

| Min. reflectance | Bottom wavelength | Resistance | Pencil Hardness | CIE color (x,y) | Transmittance (T%) |
|---|---|---|---|---|---|
| 0.14% (V-band or W-band) | 520~630 nm | 1.8~2.3 × 10² Ω/□ | 7H~9H | (0.2020, 0.1428) | 52.14% |

TABLE 2

| | Reflection (percent) | |
|---|---|---|
| Wavelength (nm) | Sputtering Coating Flat-CRT//SiO₂/Cr/ITO/ CrO$_x$/SiO₂ | Sputtering + Wet Coating Flat-CRT//SiO₂/Cr/ITO/CrO$_x$/ SiO₂//SiO$_x$ |
| 400 | 13.10 | 5.50 |
| 420 | 11.59 | 3.49 |
| 440 | 10.69 | 2.27 |
| 460 | 10.06 | 1.63 |
| 480 | 9.30 | 1.14 |
| 500 | 9.00 | 0.85 |
| 520 | 8.86 | 0.54 |
| 540 | 9.09 | 0.29 |
| 560 | 9.65 | 0.15 |
| 580 | 10.13 | 0.14 |
| 600 | 10.33 | 0.25 |
| 620 | 11.00 | 0.50 |
| 640 | 11.40 | 0.83 |
| 660 | 11.65 | 1.28 |
| 680 | 12.29 | 1.83 |
| 700 | 12.41 | 2.36 |

TABLE 3

| | Material | Thickness | Coating method | Raw material | Coating condition |
|---|---|---|---|---|---|
| layer 1 | SiO₂ | 10 ~ 30 nm | Sputtering | Si | 3 m Torr |
| layer 2 | Cr | 2 ~ 4 nm | Sputtering | Cr | 3 m Torr |
| layer 3 | ITO | 30 ~ 50 nm | Sputtering | ITO | 3 m Torr |
| layer 4 | CrO$_x$ | 10 ~ 30 nm | Sputtering | Cr | 3 m Torr |
| layer 5 | SiO₂ | 10 ~ 25 nm | Sputtering | Si | 3 m Torr |
| layer 6 | Silica | 70 ~ 90 nm | Spin coating from sol-gel | TEOS | Coating temperature: 33° C. Baking Temperature: 180 ~ 200° C./ 30 min |

We claim:

1. A combination process of vacuum sputtering and wet coating for forming a conductive and light attenuation anti-reflection coating on a substrate of a CRT surface; comprising following steps:

forming a first layer over said substrate by a vacuum coating process, said first layer comprising an oxide material having a predetermined adhesion with a glass substrate and having a refractive index within a range of 1.45 to 1.55 at a wavelength of 520 nm, said first layer having a physical thickness of 10–30 nm;

forming a second layer over said first layer by a vacuum coating process, said second layer comprising a metal having a refractive index within a range of 1.5 to 4.0 at a wavelength of 520 nm, said second layer having a physical thickness of 1–5 nm;

forming a third layer over said second layer by a vacuum coating process, said third layer comprising a conductive oxide material having a refractive index within a range of 1.85 to 2.1 at a wavelength of 520 nm, said third layer having a physical thickness of 20–60 nm;

forming a fourth layer over said third layer by a vacuum coating process, said fourth layer comprising an oxide material having a predetermined chemical resistance and a refractive index within a range of 2.0 to 2.5 at a wavelength of 520 nm, said fourth layer having a physical thickness of 10–40 nm;

forming a fifth layer over said fourth layer by a vacuum coating process, said fifth layer comprising an oxide material having a predetermined adhesion and a predetermined chemical resistance, said oxide material having a refractive index within a range of 1.45 to 1.55 at a wavelength of 520 nm, said fifth layer having a physical thickness of 10–30 nm; and forming a sixth layer over said fifth layer by a wet process, said sixth layer comprising an oxide material having a refractive index within a range of 1.45 to 1.55 at a wavelength of 520 nm, said sixth layer having a physical thickness of 60–120 nm.

2. The combination process of claim 1, wherein said substrate is CRT.

3. The combination process of claim 1, wherein said substrate is glass.

4. The combination process of claim 1, wherein the first layer is $SiO_2$, said second layer is Cr, said third layer is ITO, said fourth layer is $CrO_x$ where x=1.5, said fifth layer is $SiO_2$, and said sixth layer is silica.

5. The combination process of claim 1, wherein the first layer comprises oxides selected from the group consisting of $SiO_2$ and SiAl-Oxide.

6. The combination process of claim 1, wherein the second layer comprises metal selected from the group consisting of Cr, Ni, V, Ti, Co, Ta, and mixtures of thes metals.

7. The combination process of claim 1, wherein the third layer comprises conductive oxides selected from the group consisting of ITO, IZO and ATO.

8. The combination process of claim 1, wherein the fifth layer comprises oxides selected from the group consisting of $SiO_2$ and SiAl-Oxide.

9. The combination process of claim 1, wherein the sixth layer comprises oxides selected from the group consisting of $SiO_2$, SiAl-Oxide and SiO compound.

10. The combination process of claim 1, wherein the vacuum coating process consists of an evaporation or sputtering manufacturing process in either a batch or an in-line system.

11. The combination process of claim 1, wherein the wet process coating consists of a spin coating or spray coating or sol-gel or slurry in either a batch or an in-line system.

12. A combination process of vacuum sputtering and wet coating for forming a conductive and light attenuation anti-reflection coating on a substrate of a CRT surface; comprising following steps:

forming a first layer over said substrate by a vacuum coating process, said first layer comprising an oxide material having a predetermined adhesion with a glass substrate and having a refractive index within a range of 1.45 to 1.55 at a wavelength of 520 nm, said first layer having a physical thickness of 10–30 nm;

forming a second layer over said first layer by a vacuum coating process, said second layer comprising a metal having a refractive index within a range of 1.5 to 4.0 at a wavelength of 520 nm, said second layer having a physical thickness of 1–5 nm;

forming a third layer over said second layer by a vacuum coating process, said third layer comprising a conductive oxide material having a refractive index within a range of 1.85 to 2.1 at a wavelength of 520 nm, said third layer having a physical thickness of 20–60 nm;

forming a fourth over said third layer by a vacuum coating process, said fourth layer comprising a nitride material selected from the group consisting of TiN, TaN, TrN, and NbN having a refractive index within a range of 2.0 to 2.5 at a wavelength of 520 nm, said fourth layer having a physical thickness of 10–40 nm;

forming a fifth layer over said fourth layer by a vacuum coating process, said fifth layer comprising an oxide material having a predetermined adhesion and a predetermine chemical resistance, said oxide material having a refractive index within a range of 1.45 to 1.55 at a wavelength of 520 nm, said fifth layer a physical thickness of 10–30 nm; and forming a sixth layer over said fifth layer by a wet process, said sixth layer comprising an oxide material having a refractive index within a range of 1.45 to 1.55 at a wavelength of 520 nm, said sixth layer having a physical thickness of 60–120 nm.

* * * * *